United States Patent [19]

Bundy et al.

[11] Patent Number: 4,893,049
[45] Date of Patent: * Jan. 9, 1990

[54] LITHIUM NIOBATE EXPLOSION MONITOR

[75] Inventors: Charles H. Bundy, Clearwater, Fla.; Robert A. Graham, Los Lunas, N. Mex.; Stephen F. Kuehn, Albuquerque, N. Mex.; Richard R. Precit, Albuquerque, N. Mex.; Michael S. Rogers, Albuquerque, N. Mex.

[73] Assignee: The United States of America as represented by the United States Department of Energy, Washington, D.C.

[*] Notice: The portion of the term of this patent subsequent to Dec. 9, 2004 has been disclaimed.

[21] Appl. No.: 868,375
[22] Filed: May 29, 1986
[51] Int. Cl.⁴ .................................................. H01L 41/08
[52] U.S. Cl. ............................................ 310/338; 73/35; 73/167; 73/DIG. 4; 310/311; 310/318; 310/319; 310/360
[58] Field of Search ............... 310/311, 314, 315, 318, 310/319, 323, 334, 338, 343, 345, 360, 363, 364, 369; 73/1 R, 1 B, 35, 167, 432 R, 700, DIG. 4

[56] References Cited

U.S. PATENT DOCUMENTS

| | | | |
|---|---|---|---|
| 3,591,813 | 7/1971 | Coquin et al. | 310/360 X |
| 3,714,476 | 1/1973 | Epstein | 310/360 X |
| 3,727,084 | 4/1973 | Epstein | 310/360 X |
| 3,735,161 | 5/1973 | Perkins et al. | 310/360 X |
| 3,756,070 | 9/1973 | McElroy | 310/360 X |
| 3,858,065 | 12/1974 | Epstein | 310/360 X |

Primary Examiner—Mark O. Budd
Attorney, Agent, or Firm—George H. Libman; Albert Sopp; Judson R. Hightower

[57] ABSTRACT

Monitoring explosive devices is accomplished with a substantially z-cut lithium niobate crystal in abutment with the explosive device. Upon impact by a shock wave from detonation of the explosive device, the crystal emits a current pulse prior to destruction of the crystal. The current pulse is detected by a current viewing transformer and recorded as a function of time in nanoseconds. In order to self-check the crystal, the crystal has a chromium film resistor deposited thereon which may be heated by a current pulse prior to detonation. This generates a charge which is detected by a charge amplifier.

9 Claims, 5 Drawing Sheets

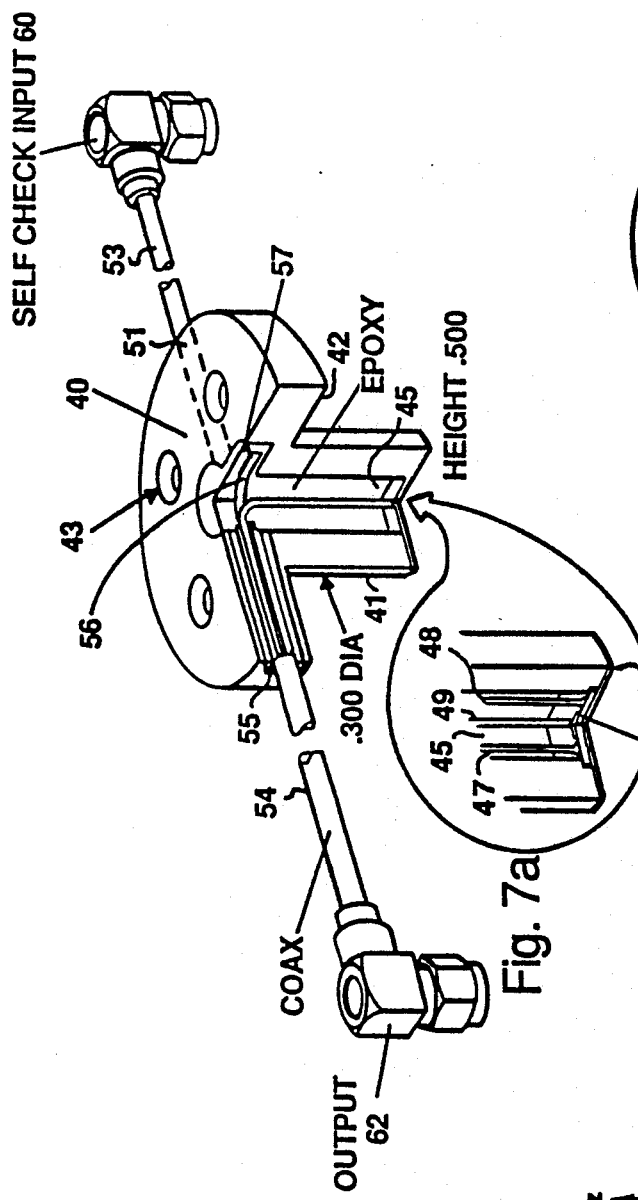
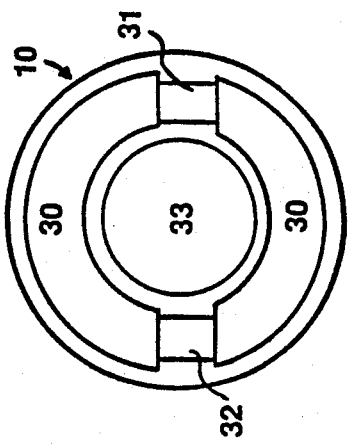
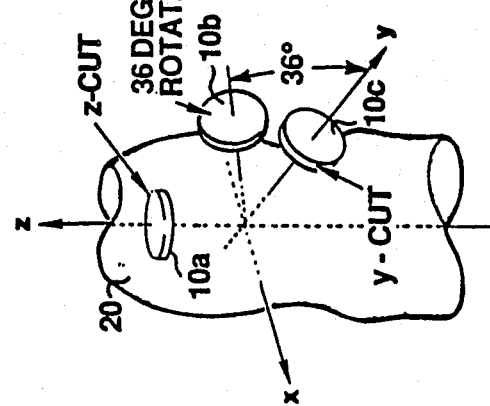

LITHIUM NIOBATE EXPLOSION MONITOR

The U.S. Government has rights in this invention pursuant to Department of Energy Contract No. DE-AC04-76DP00789 with AT&T Technologies, Inc., and Contract No. DE-AC04-76DP00656 with General Electric Corporation.

BACKGROUND OF THE INVENTION

1. Field of the Invention

The present invention relates to apparatus for and methods of monitoring functioning of explosive devices. More particularly, the invention relates to apparatus for and methods of monitoring functioning of explosive devices utilizing lithium niobate crystals as detonation monitors.

2. Technical Considerations and Prior Art

A general trend in configuring devices for monitoring explosions is to utilize optical instrumentation. However, optical devices are relatively large, expensive and complex and require relatively sophisticated systems for their operation. If optical systems are utilized, the amount of detonator explosive material must be increased to achieve sufficient signal levels. This has serious implications for explosive containment and can cause collateral damage to other components. Moreover, at low energy levels optical monitors are entirely passive and, therefore, cannot be excited for self-check purposes to determine if the monitoring device is functioning.

There has been investigation into using the piezoelectric effect of crystal devices for monitoring detonations. However, piezoelectric materials such as barium titanate ($BaTiO_3$), lead zirconate titanate (PZT), and crystals such as quartz cannot withstand high stress levels in excess of hundreds of kilobars reliably enough to produce a piezoelectric response for generating a readable output current.

U.S. Pat. No. 3,714,476 of Epstein discloses a lithium niobate crystal arranged at a particular angle for use as a compression accelerometer over a long period of time at elevated temperatures. This patent is typical of lithium niobate devices useful for low signal applications but incapable of providing an output at the pressures for which the present invention is designed.

U.S. Pat. No. 3,307,052 of Neilson, et al. uses a disk of x-cut crystal to measure the effect of a detonation or other impact. This device is restricted to monitoring much lower pressures than applicants' invention.

Monitoring the time explosions has typically been restricted to detection times of tens of nanoseconds. No known prior art detector is fast enough to provide a response within a few nanoseconds that more accurately represents the initiation of the explosion.

OBJECTS OF THE INVENTION

It is an object of this invention to provide an explosive monitor with response time rapid enough to accurately measure the initiation of the explosion.

It is another object of this invention to provide an explosive monitor with the capability of verifying (self-checking) crystal function just prior to detonation.

Additional objects, advantages and novel features of the invention will become apparent to those skilled in the art upon examination of the following description or may be learned by practice of the invention. The objects and advantages of the invention may be realized and attained by means of the combinations particularly pointed out in the appended claims.

To achieve the foregoing and other objects, and in accordance with the purpose of the present invention, as embodied and broadly described herein, the explosive monitor of this invention may comprise a lithium niobate crystal wafer cut substantially along the z-axis, means such as a low impedance transformer connected across the crystal to detect a piezoelectric current output caused by an explosive force impacting a face of the crystal, and means for nondestructively checking the responsiveness of the crystal prior to the destructive explosion. The checking is accomplished by heating the crystal and detecting charge generated by the crystal in response to the heating. The invention further comprises the method of detecting the occurrence of an explosion using the aforementioned monitor.

BRIEF DESCRIPTION OF THE DRAWINGS

Various other objects, features and attendant advantages of the present invention will be more fully appreciated as the same becomes better understood when considered in connection with the accompanying drawings, in which like reference characters designate the same or similar parts throughout the several views, and wherein:

FIG. 2 is a perspective view showing lithium niobate crystal stock with crystals cut therefrom at various angles;

FIG. 3 is a front face view of a lithium niobate crystal showing a sputtered chromium film resistor deposited thereon;

FIG. 7a is a perspective view showing a detonator monitor in accordance with the instant invention mounted in a fixture for utilizing the monitor; and FIG. 7b is an enlarged perspective view showing the crystal end of the fixture.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

DESCRIPTION OF THE PREFERRED EMBODIMENT

As described herein, this invention provides an explosive monitor that uses the fast response of a lithium niobate crystal to generate a fast current pulse representative of the shock wave generated by an explosive.

Figure 1:
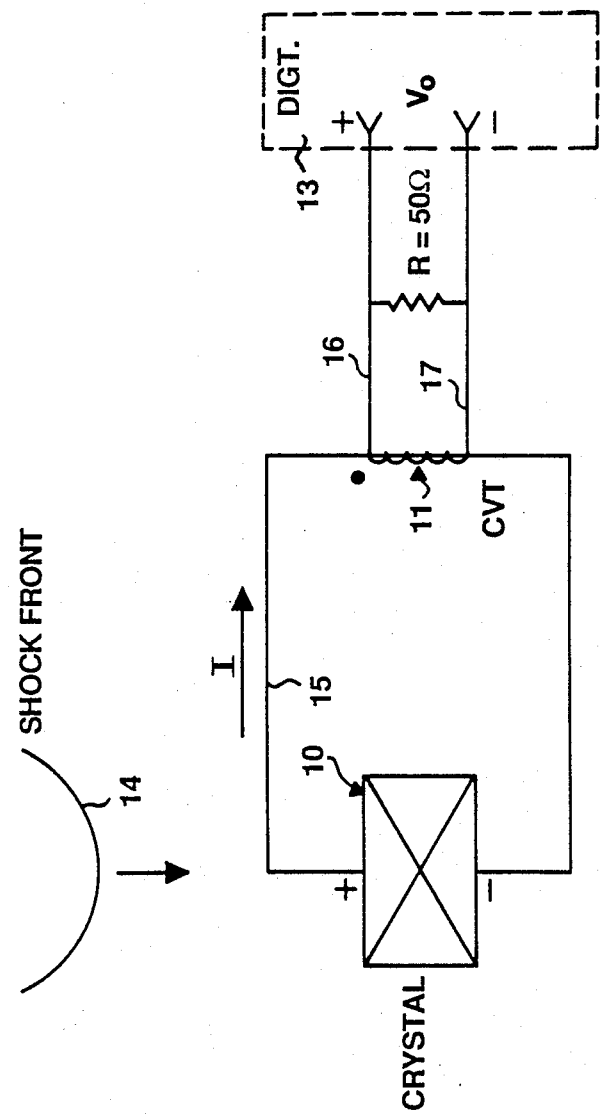
FIG. 1 is a diagrammatical view of a lithium niobate, detonator monitor circuit in accordance with the principles of the instant invention.

Referring now to FIG. 1 there is shown schematically a lithium niobate crystal 10 in series with a current viewing transformer (CVT) 11. The output of the current viewing transformer 11 is monitored by a device such as a digitizer 13 (for example, a Tektronix 7918 AD digitizer), which records the current detected by the transformer as a function of time. In operation, a high pressure shock front 14 from an explosive device such as an explosive detonator impinges on the face and forces rapid compression of the crystal 10. In response to the stress created by this rapid compression, the crystal emits a current burst "I" in the circuit 15 which is monitored by current viewing transformer 11, which transformer typically comprises a straight wire primary having a secondary coil wound around it.

Although the usual method for monitoring piezoelectric crystals is to measure charge signals, the signal being measured with the circuit of FIG. 1 is a current signal. Accordingly, the lithium niobate crystal 10 operates in a "current mode" as opposed to a "charge mode." The reason for this operation is that the charge mode is somewhat slower than the current mode and does not give the rapid response needed for precise timing of the shock wave of an explosion.

In a typical piezoelectric response 16 of the crystal 10 to a firing of a detonator, the current generated by the crystal 10 is monitored by a current viewing transformer 11 having a gain set at 1 volt/ampere (50 ohm resistor R connected across the leads 16 and 17 of the transformer). The output voltage "$V_o$" is proportional to the current sent through the primary of the current viewing transformer 11. The output, as monitored by the digital 13, shows lithium niobate crystal 10 (in this case, a crystal having a diameter of 0.225 inches and a thickness of 0.0125 inches) to supply a peak current greater than 10 amperes with a rise time of a very few nanoseconds. In particular, the width of the pulse at 4 amperes is approximately 55 nanoseconds; the width of the pulse at 50% of the rise is 50 nanoseconds, and the rise time between 25% and 75% of the peak amperage is less than 10 nanoseconds.

Accordingly, the monitor of the present invention provides an electrical signal indicative of the rise time of the impacting explosive shock wave. The rise time of this monitor is orders-of-magnitude faster than the rise time of known prior art monitors.

It is known that the operation of a stress transducer is dependent upon using a crystal material in a configuration such that, under shock load, an elastic wave traverses the crystal faster than a plastic wave. Furthermore, the volume between the elastic wave and the plastic wave must have low conductivity and be polarized due to the piezoelectric effect of elastic stress. The volume on the other side of the plastic wave must have high electrical conductivity. At low pressures, quartz satisfies these conditions. At the high pressures generated by an explosive, the plastic wave proceeds through quartz faster than the elastic wave, rendering quartz useless as a transducer of explosive shock.

Applicants have found a lithium niobate crystal having spaced parallel faces, as shown in FIG. 2, cut from crystal stock 20 having lateral axes "x" and "y" and a unique polar axis "z", meets the criteria for a stress transducer of an explosive shock wave when the faces are substantially perpendicular to axis "z". The results given above were for a crystal cut within one degree of perpendicular to axis "z". As the face cut is changed away from perpendicular to axis "z", the output of the transducer increases as the conductivity of the volume between the elastic and plastic waves decreases. At some angle unknown to applicants but determinable by routine experimentation, this volume becomes a short circuit, destroying the electrical output of the crystal.

Accordingly, this invention contemplates the use of a lithium niobate crystal having faces cut substantially perpendicular to axis "z", where "substantially perpendicular" is defined as extending from perpendicular to the angle where the electrical output is destroyed.

As discussed above, a properly cut crystal of lithium niobate has the properties required for detecting the shock wave of a high pressure explosion. However, the prior art has considered the effect of heat on this material to be a disadvantage in pressure transducer applications. This invention advantageously uses this property of lithium niobate to enable the crystal to be checked before the explosive is detonated.

Ten of the twenty piezoelectric crystal classes are characterized by a unique polar axis where one end of the crystal is permanently polarized positive and the other end is permanently polarized negative. The permanent polarization of these crystals cannot be detected by charges on the surface of the crystal because these charges have been compensated by the external or internal conductivity of the crystal. However, the value of the permanent polarization is dependent on the temperature of the crystal. If the temperature is altered, a change in the polarization causes electric charges that can be observed on crystal faces perpendicular to the polar axis. This is the pyroelectric effect.

Observation of the pyroelectric effect is complicated because every pyroelectric crystal is also piezoelectric. Therefore, a nonuniform change in crystal temperature causes a mechanical deformation of the crystal, producing a piezoelectric output superimposed on the pyroelectric output. However, in this invention it is immaterial whether the detected output from heating, as discussed hereinafter, is caused by pyroelectric or piezoelectric effects. According to the invention, if charge is detected when heat is applied to the crystal, the crystal is presumed to be working and capable of measuring the shock of an explosion.

Figure 6:
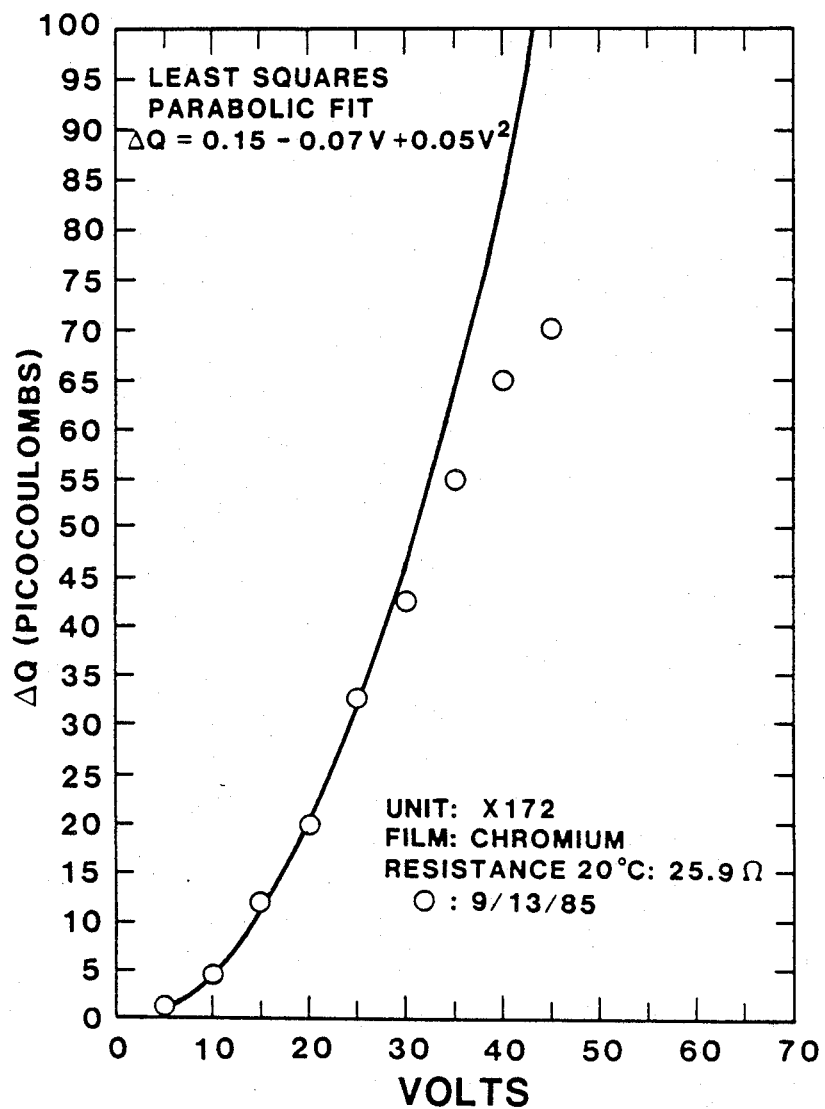
FIG. 6 is a graph plotting charge versus voltage input showing how a charge generated in a lithium niobate crystal with a deposited chromium film resistor is proportional to the square of the voltage input, or in other words, the power input.

FIG. 3 shows a preferred embodiment for heating crystal 10. A chromium film resistor 30 is sputtered on the positive end of z-cut lithium niobate crystal wafer 10. A pair of lateral gold pads 31 and 32 are provided for soldering leads to the resistor 30. The resistance is formed along the two parallel paths between the gold pads 31 and 32. In accordance with a preferred embodiment, the overall diameter of the crystal 10 is 0.225 inches, the inside diameter of the chromium film 30 is 0.120 inches and the outside diameter of the film is 0.205 inches. The sputtered chromium film 30 is approximately 3,000 angstrom units thick. The impedance between pads 31 and 32 is approximately 26 ohms (FIG. 6). A central gold pad 33 is deposited on the lithium niobate crystal 10 for establishing contact with the circuit 15.

Although resistor 30 and pads 31–33 were applied to the positive end of crystal 10, they could also be applied to the negative end. In the preferred embodiment, these elements are in contact with the positive face of crystal 10 facing away from the explosive under test. The negative face of crystal 10 faces the explosive.

Figure 4:
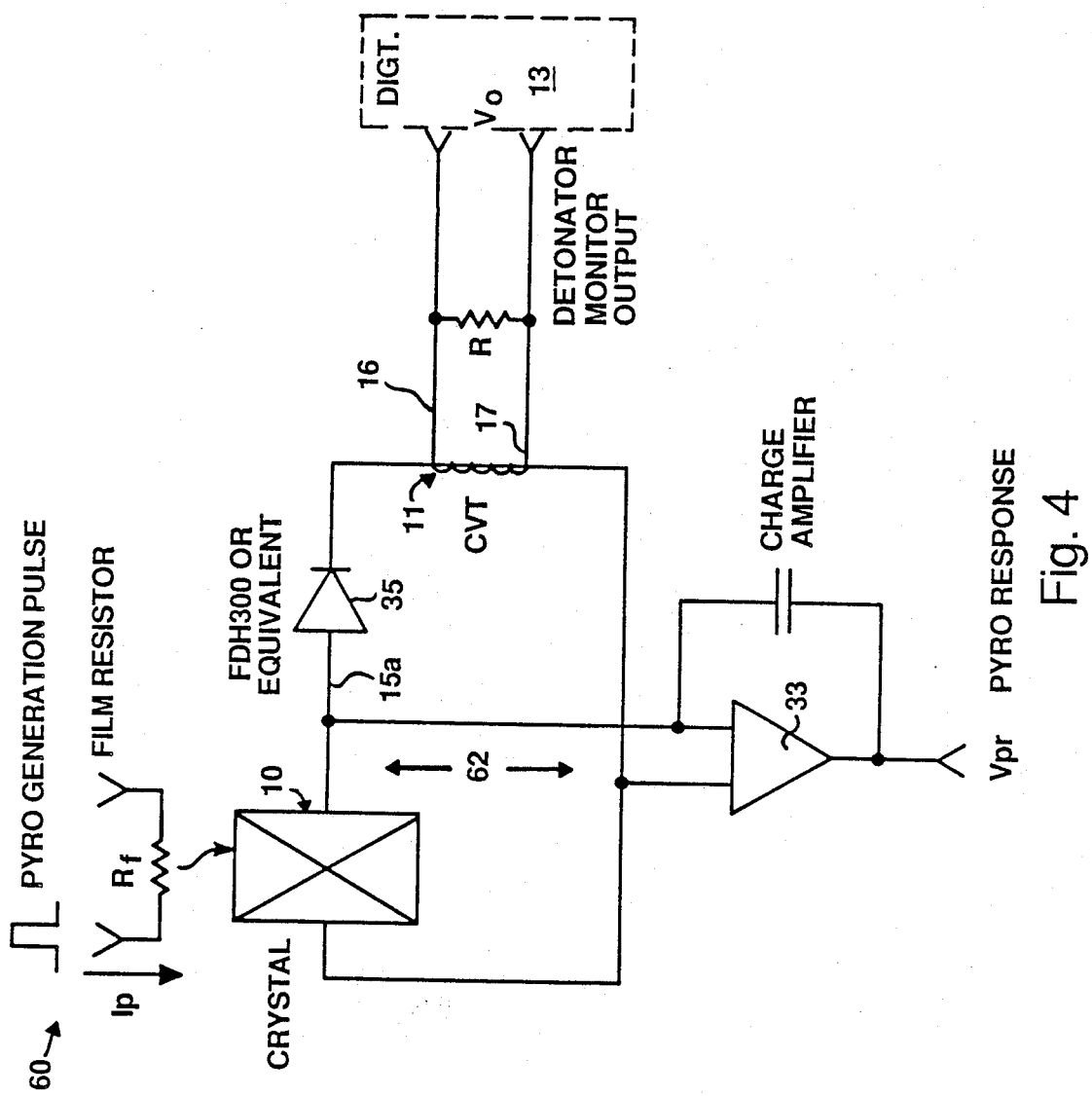
FIG. 4 is a circuit diagram showing a lithium niobate crystal monitoring circuit with a self-checking capability.

Referring now to FIG. 4, there is shown circuitry for observing the self-check response. The self-check signal is a charge pulse in the circuit 15a, measured in picocoulombs, which is, of course, different from the detonator monitor signal current measured in amperes. In FIG. 4, the current viewing transformer 11 and the resistor R function as previously described with respect to FIG. 1. In accordance with the FIG. 4 embodiment, the current viewing transformer 11 detects the detonation signal while a charge amplifier 33 detects the self-check signal. In order to eliminate elaborate switching that could detrimentally affect the reliability of the system, a diode 35 (such as an FDH300) is inserted in the circuit 15a. Because the charge generated by the crystal 10 cannot forward bias the diode 35, the diode presents a high impedance to prevent the current viewing transformer 11 from interfering with the pyroelectric self-check signal. When the detonator is fired, the diode 35 easily conducts the resulting high current to the current viewing transformer 11, while the charge amplifier 33 has a high enough input impedance to minimize the effect of the charge amplifier on the detonator response.

Figure 5:
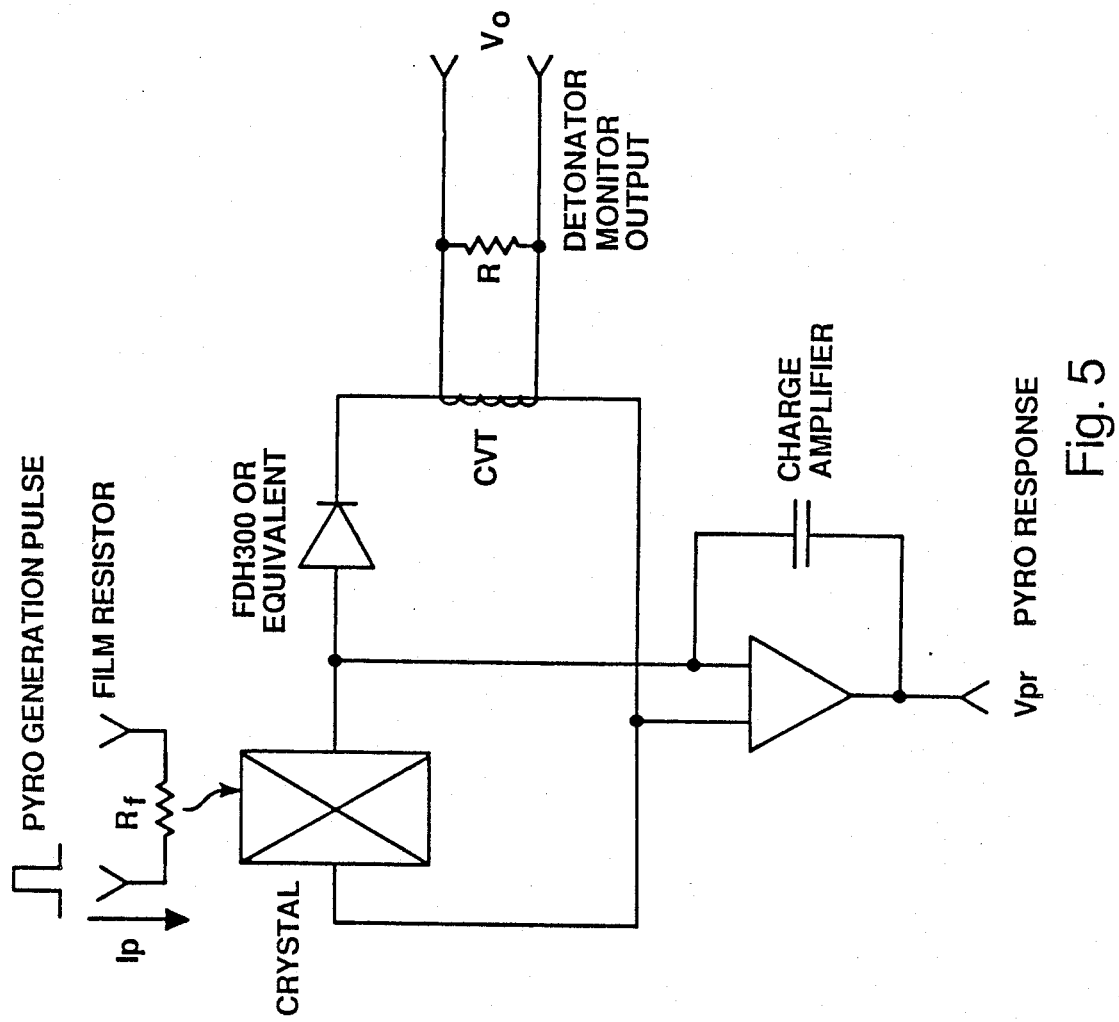
FIG. 5 is a graphical representation showing the pyroelectric response of a lithium niobate crystal due to pulsing a chromium film resistor deposited thereon.

FIG. 5 shows a top trace 36 illustrating a 100 microsecond, 28 volt pulse applied to the resistive film 30. The lower trace 37 begins with capacitive coupling through the charge amplifier 33 with the crystal response superimposed thereupon. After 100 microseconds the capacitive coupling ceases and the crystal response predominates.

Referring now to FIG. 6, which shows a plot of charge versus voltage input, it is seen that the charge generated for low voltage is proportional to the square of the voltage, or in other words, to the power input. At higher voltages, the points deviate because the temperature coefficient of the resistance becomes significant and increases the overall resistance of the deposited chromium film 30 (see FIG. 3). This, in effect, lowers the amount of power actually applied to the lithium niobate crystal 10. The forward impedance of the diode 35 prevents the charge from being shorted by the output circuit 15a (see FIG. 5). The charge amplifier 33, a high gain operational amplifier, in combination with a feedback capacitor C, provides voltage output indicative of the charge from the crystal 10. This charge is measured to provide an indication of the state of operation of crystal 10. If repeatable measurements are made, the probability that the device will work for a detonation is high. If no output from charge amplifier 33 is detected, the probability of failure under explosive test is high.

Referring now to FIG. 7, wherein a stainless steel mounting fixture 40 is shown, the lithium niobate crystal 10 is mounted at the end of a stem 41 which projects from a flange 42. The flange 42 has countersunk holes 43 therein for securing the fixture 40 to a detonator (not shown). The crystal 10 is in direct contact with the detonator so as to sense practically instantaneously the shock wave admitted therefrom. Stem 41 has a bore therethrough which is filled with epoxy 45. The crystal 10 has its back surface imbedded in a silicone bed 46 with gold wire leads 47, 48 and 49, each 0.006 inches in diameter, passing therethrough up into lateral bores 51 in the flange 42. The leads 47 and 48 for the self-check input 60 enter through cable 53 while the center lead 49 for the output 62 is the center conductor in coaxial cable 54. The outer conductor 56 of the coaxial cable feeds through brass sleeve 55 to a stainless steel sleeve 57 that is laser welded to stainless steel fixture 40. The crystal 10 is grounded to the stainless steel fixture by a one micron thick chrome/gold contact 57. While the explosive force monitored is large enough to crush the crystal 10, the crystal is not crushed before the electrical output is generated.

The particular sizes, equipment, and circuits discussed above are cited merely to illustrate a particular embodiment of this invention. It is contemplated that the use of this invention may involve components having different sizes and shapes as long as the principal, using a lithium niobate crystal cut substantially at a z-cut, as described herein, with self-check means for checking the crystal before the destructive explosion, is followed. It is intended that the scope of the invention be defined by the claims appended hereto.

What is claimed is:

1. An explosive monitor including:
    means for providing an electrical output indicative of the detonation of an explosive material, said means comprising:
    a lithium niobate crystal wafer having spaced parallel faces cut substantially perpendicular to a unique polar axis "z"; and
    first means for detecting a piezoelectric current output of said crystal indicative of the detonation of an explosive material; and
    checking means for nondestructively checking the responsiveness of said crystal prior to detonation of the explosive material, said checking means comprising:
    second means for controllably heating said crystal; and
    third means for detecting a pyroelectric charge output of said crystal responsive to the heating of said crystal by said second means.

2. The explosive monitor of claim 1 wherein said first means comprises:
    a current viewing transformer having a low impedance input electrically connected to receive the piezoelectric output of said crystal; and
    electrical recording means for recording a received signal, said means having an input electrically connected to an output of said transformer.

3. The explosive monitor of claim 2 wherein said third means has an input connected in parallel with said crystal; and further comprising a diode connected in series between said crystal and said input of said current viewing transformer, said diode providing a high impedance to said pyroelectric charge and a low impedance to said piezoelectric current.

4. The explosive monitor of claim 3 wherein said third means comprises a charge amplifier having input means for receiving the pyroelectric charge output of said crystal, and output means for providing a voltage output indicative of said received charge.

5. The explosive monitor of claim 1 wherein said second means comprises:
    an electrical resistor in contact with one face of said crystal; and
    means for applying an electrical pulse across said resistor.

6. The explosive monitor of claim 5 wherein said electrical resistor comprises a film resistor affixed to said one face of said crystal.

7. The explosive monitor of claim 6 wherein said film resistor is chromium.

8. The explosive monitor of claim 6 wherein said one face of said crystal is positive and said other face is negative; and further comprising:
    a tubular metal housing, wherein said crystal wafer is mounted at one end of said housing with said positive face and said resistor facing into said housing and said negative face facing out of said housing;

a pair of electrical conductors extending from said film resistor through said housing to an input for an electrical signal;
a conductive coating affixed to said negative face and electrically connected to said housing; and
a third electrical conductor extending from said positive face through said housing, whereby said crystal output is detected across said third electrical conductor and said housing.

9. A method for monitoring the detonation of an explosion comprising:

positioning adjacent an explosive a negative face of a lithium niobate crystal wafer having spaced parallel faces cut substantially perpendicular to a unique polar axis "z";
impinging a thermal pulse on said crystal;
measuring the electrical charge generated by crystal as a result of said thermal pulse to check the responsiveness of said crystal; and
measuring the piezoelectric current generated by said crystal as a result of the impact of the explosion on said crystal face.

* * * * *